United States Patent [19]
Yamada et al.

[11] Patent Number: 5,607,559
[45] Date of Patent: Mar. 4, 1997

[54] METHOD OF FORMING THIN FILM ON SUBSTRATE BY REACTIVE DC SPUTTERING

[75] Inventors: Masayuki Yamada; Akira Ishikawa; Tadahiko Saito, all of Tokyo; Kiyoshi Nakase, Taki-gun; Katsuyuki Hatanaka, Tsu; Hiroshi Inaba, Matsusaka, all of Japan

[73] Assignee: Central Glass Company Limited, Ube, Japan

[21] Appl. No.: 391,305

[22] Filed: Feb. 21, 1995

Related U.S. Application Data

[63] Continuation of Ser. No. 51,957, Apr. 26, 1993, abandoned.

[30] Foreign Application Priority Data

Apr. 27, 1992 [JP] Japan .................................. 4-107934
Nov. 27, 1992 [JP] Japan .................................. 4-318906

[51] Int. Cl.$^6$ ...................................................... C23C 14/34
[52] U.S. Cl. ................................ 204/192.13; 204/298.03; 204/192.12
[58] Field of Search ........................ 204/192.12, 192.13, 204/298.03, 298.08, 192.22

[56] References Cited

U.S. PATENT DOCUMENTS 4,166,784  9/1979  Chapin et al. ................... 204/192 R
5,108,569  4/1992  Gilboa et al. ................. 204/298.03 X
5,292,417  3/1994  Kugler ......................... 204/298.03 X

FOREIGN PATENT DOCUMENTS 0430229  6/1991  European Pat. Off. .
64-79369  3/1989  Japan .

OTHER PUBLICATIONS

Patent Abstracts of Japan, vol. 13, No. 079, Feb. 22, 1989.
Patent Abstracts of Japan, vol. 13, No. 286, Jun. 29, 1989.

*Primary Examiner*—Nam Nguyen
*Attorney, Agent, or Firm*—Keck, Mahin & Cate

[57] ABSTRACT

A method of forming a metal oxide film on a substrate by a reactive DC sputtering device with introducing thereinto a reaction gas and an inert gas includes the steps of: (a) regulating a flow rate ratio or a pressure ratio of the reaction gas to the inert gas to not higher than 0.4; (b) increasing a power input to the sputtering device to a first predetermined value such that a discharge voltage increases to a maximum value and then decreases from the maximum value; and (c) decreasing the power input from the first predetermined value to a second predetermined value immediately after the discharge voltage starts to decrease from the maximum value so as to suppress a metal formation on the substrate, the steps (b) and (c) being alternately repeated for a certain period for completing the metal oxide formation on the substrate.

6 Claims, 6 Drawing Sheets

METHOD OF FORMING THIN FILM ON SUBSTRATE BY REACTIVE DC SPUTTERING

This is a continuation application of Ser. No. 08/051,957, filed on Apr. 26, 1993, now abandoned.

BACKGROUND OF THE INVENTION

This invention relates to a method of forming a thin film on a substrate by the reactive DC sputtering.

It is usual to use oxygen gas as a reactive gas and argon gas as an inert gas for a conventional reactive DC sputtering. Hitherto, a conventional reactive DC sputtering has been conducted through a constant electric power or a constant electric current. However, in the conventional reactive DC sputtering, a reaction film tends to be formed on a metal target surface during sputtering through the reaction between the reactive gas and the metal of the target. This reaction film lowers the sputtering rate and induces the occurrence of abnormal discharge. Due to the occurrence of abnormal discharge, impurities tend to stick to a substrate surface. With this, the external appearance of the film and the film characteristics tend to be deteriorated.

JP-A-64-79369 proposes a sputtering method in which sputtering power input is increased substantially exponentially from the beginning of sputtering as a film accumulates on a substrate. The sputtering rate is increased by this method. However, discharge does not always become stable and the maximum sputtering rate can not always be maintained by this method.

It is generally known in a reactive DC sputtering that a reaction film is formed on a metal target surface, and that the maximum discharge voltage which can be applied between a target and a substrate fluctuates. Due to this fluctuation, the sputtering rate fluctuates, too. The maximum discharge voltage corresponds to the maximum sputtering rate. That is, when the discharge voltage is at the maximum, the sputtering rate becomes maximum, too. Discharge becomes stable at the maximum or nearly maximum sputtering rate. It should be noted that the maximum or nearly maximum sputtering rate can not always be maintained by the above-mentioned constant power input and the exponentially increasing power input.

SUMMARY OF THE INVENTION

It is therefore an object of the present invention to provide an improved method of forming a thin film by the reactive DC sputtering, which is free of the above-mentioned drawbacks.

According to the present invention, there is provided a method of forming a metal oxide film on a substrate by a reactive DC sputtering device with introducing thereinto a reaction gas and an inert gas, comprising the steps of:

(a) increasing a power input to the sputtering device to a first predetermined value such that a discharge voltage increases to a maximum value and then decreases from the maximum value; and (b) decreasing the power input from the first predetermined value to a second predetermined value immediately after the discharge voltage starts to decrease from the maximum value so as to suppress a metal formation on the substrate, the steps (a) and (b) being alternately repeated for a certain period for completing the metal oxide formation on the substrate.

According to the present invention, the maximum or nearly maximum sputtering rate can be maintained, and the abnormal discharge can be suppressed.

DESCRIPTION OF THE PREFERRED EMBODIMENTS

According to the present invention, the power input during a reactive DC sputtering is fluctuated in the undermentioned manner. With this, the maximum or nearly maximum sputtering rate can be maintained during the sputtering. If the value of discharge voltage is set to be lower than the maximum value, the sputtering rate is also set to be lower than the maximum value.

Figure 1:
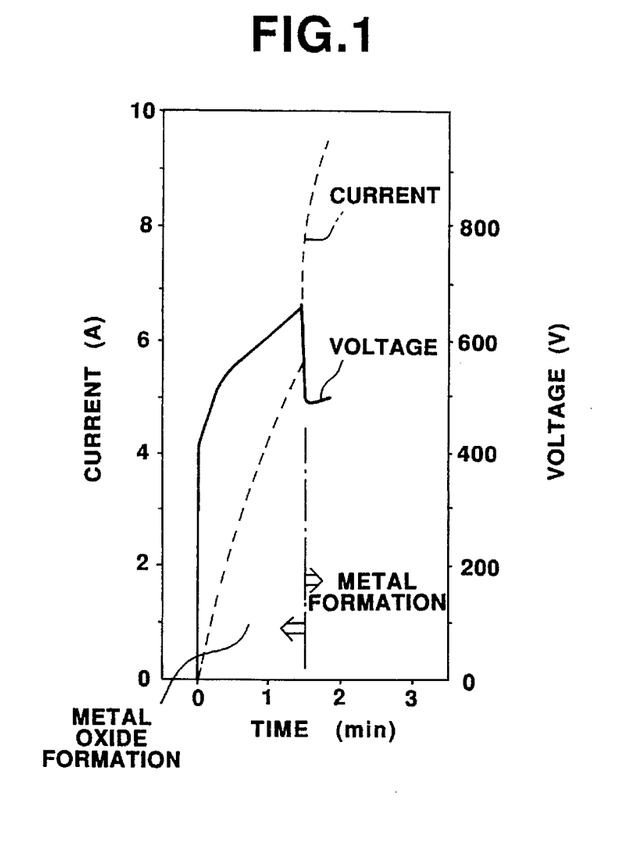
FIG. 1 is a graph showing the changes in voltage and current by the increase of power input over time.

As is seen from FIG. 1, when the power input is increased over time to a certain predetermined value (3.8 kW) in a sputtering with using oxygen gas as a reactive gas, argon gas as an inert gas and a target of tungsten or tantalum, the discharge voltage becomes to the maximum value (about 660 V) in about 90 sec. from the beginning of the power input increase. Within this range, i.e. the range in which the power input is from 0 to 3.8 kW, a metal oxide film is formed on a substrate. If the power input is continuously increased from 3.8 kW, the discharge voltage is drastically decreased from the maximum value, as illustrated, and a metal of the target is undesirably formed on the substrate. At the same time when the discharge voltage is drastically decreased, the discharge current is drastically increased from about 5.8 A, as illustrated.

In the present invention, it is preferable that flow rate ratio or pressure ratio of the reactive gas to the inert gas is not greater than 0.4. With this, the maximum or nearly maximum sputtering rate can be maintained, and the occurrence of abnormal discharge is decreased. If flow rate ratio or pressure ratio of the reactive gas to the inert gas is greater than 0.4, the occurrence of abnormal discharge is noticeably increased. If it is desired to drastically decrease the occurrence of abnormal discharge, the flow rate ratio or the pressure ratio is set to be not greater than 0.3. If it is desired to more drastically decrease the occurrence of abnormal discharge, the flow rate ratio or the pressure ratio is set to be not greater than 0.2. If it is desired to almost suppress the occurrence of abnormal discharge, the flow rate ratio or the pressure ratio is set to be not greater than 0.1.

According to the present invention, the following steps are taken in the reactive DC sputtering for the purpose of obtaining the maximum or nearly maximum sputtering rate.

Figure 3:
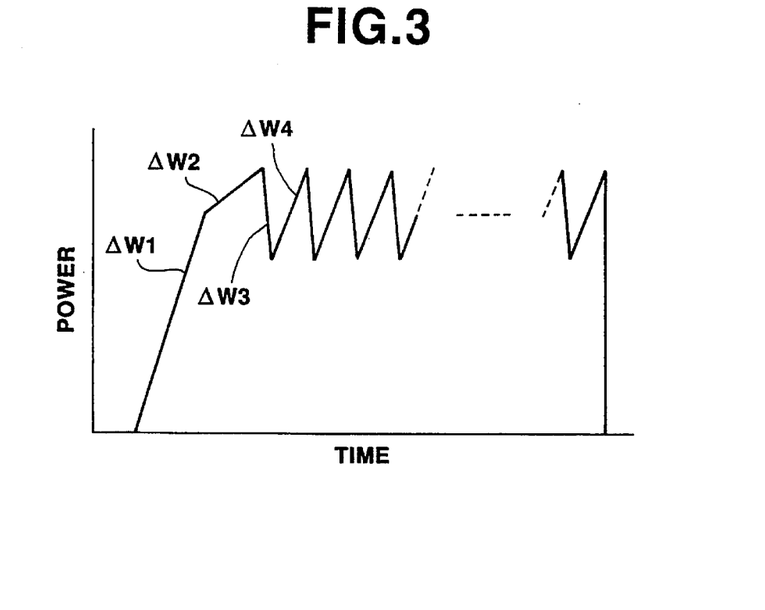
FIG. 3 is a graph showing a power input control pattern over time in accordance with the present invention.

With reference to FIGS. 1 and 3, as a first step, the power input is increased to a first predetermined value to obtain the maximum discharge voltage. Then, as a second step, immediately after the discharge voltage starts to decrease and, at the same time, the discharge current starts to increase steeply, the power input is decreased from the first predetermined value to a second predetermined value so as to suppress a metal formation on the substrate. Then, the first and second steps are alternately repeated for a certain period for the purpose of a metal oxide formation on a substrate.

If the above-mentioned steps are manually controlled, the timing to start the second step becomes unstable. With this, the discharge voltage substantially fluctuates, thereby fluctuating the film formation rate. Therefore, it is desirable that the power input control is automatically taken by a sequencer or a computer.

Figure 2:
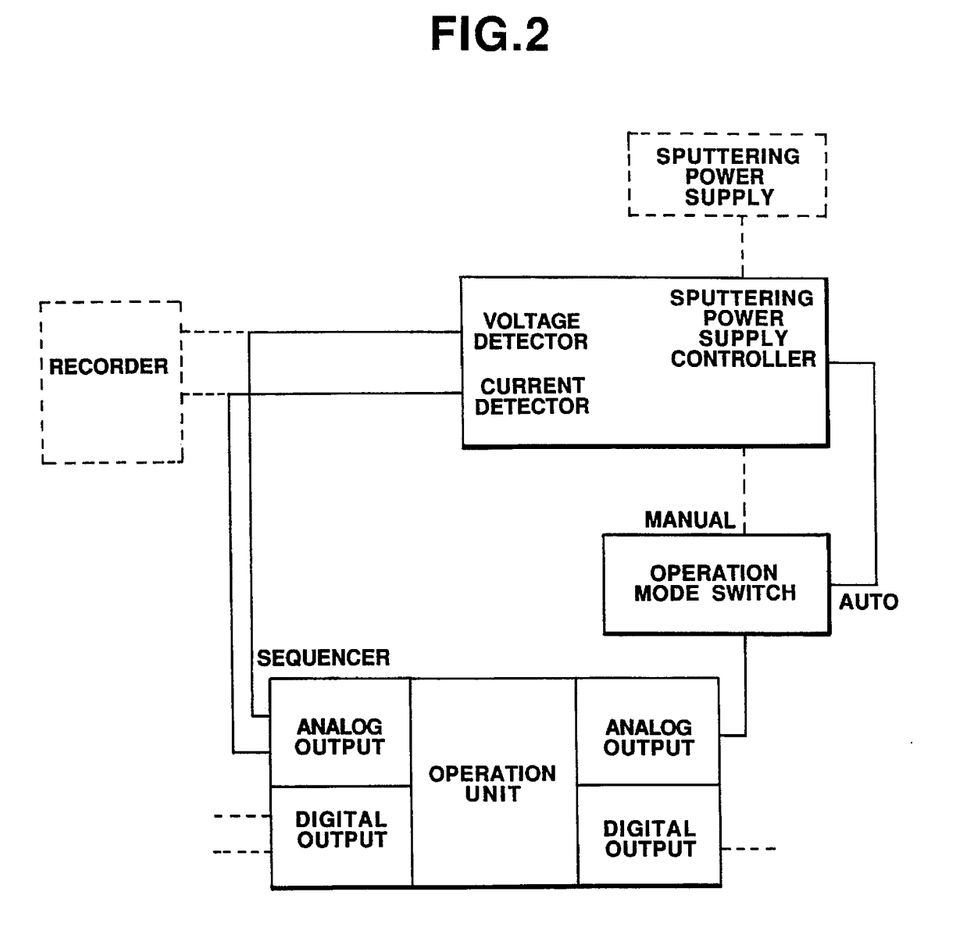
FIG. 2 is a block diagram showing a high speed sputtering control device.

With reference to FIG. 2, an automated high-speed sputtering control device according to the present invention will be described in the following.

The sputtering control device comprises a sputtering power supply controller and a sequencer. A signal from the sequencer is conveyed to a sputtering power supply. Electric power is supplied from the sputtering power supply to a sputtering device. An analog input unit of the sequencer takes the values of discharge voltage and discharge current of the sputtering power supply controller from a detector and convert them to digital signals. A digital input unit takes control signals such as parameters of fluctuation pattern of discharge voltage or discharge power from a rotary switch or the like and start and stop signals for starting and stopping the device. An operation unit computes by a program the signals taken from the analog input unit and the digital input unit. An analog output unit converts the computed result to an analog output and outputs signals of discharge voltage or discharge power (voltage signals ranging from 0 to 5 V). The sputtering power supply controller conveys control signals to a sputtering power supply. The sputtering power supply outputs power to a sputtering device. A digital output unit displays input parameters. In an operational mode switching unit, the automated operational mode is switched to the manual mode, and vice versa.

According to the present invention, the electric power input to the sputtering device is controlled by the following steps.

As is seen from FIG. 3, firstly, the discharge power is steeply increased at $\Delta w_1$ and gently at $\Delta w_2$ to a first predetermined value. Immediately after the discharge voltage decreases from the maximum discharge voltage, the discharge power is steeply decreased from the first predetermined value to a second predetermined value at $\Delta w_3$ so as to suppress a metal formation on a substrate. Then, the discharge power is again increased at $\Delta w_4$ until the discharge voltage starts to decrease from the maximum value. Then, $\Delta w_3$ and $\Delta w_4$ are alternately repeated for a certain period to complete a metal oxide film formation on a substrate.

A period of not longer than 6 sec is preferably set for the duration in which discharge voltage is decreased at $\Delta w_3$ and increased at $\Delta w_4$ for the purpose of suppressing the decrease of sputtering rate. It is preferable that a deviation of discharge voltage is not greater than 6% of the average of the maximum discharge voltage. Under a condition in which the flow rate ratio or the pressure ratio of the reactive gas to the inert gas is constant, the sputtering rate increases as the period and the deviation decrease.

To take the above-mentioned steps, it is necessary to detect the timing of the beginning of the decrease of discharge voltage from the maximum discharge voltage and, at the same time, the timing of the beginning of the steep increase of discharge current. Furthermore, it is necessary to neglect abnormal discharge.

It should be noted that even if a constant power input is used in a reactive DC sputtering, discharge voltage and discharge current always fluctuate. That is, if discharge voltage increases, discharge current decreases. On the other hand, if discharge voltage decreases, discharge current increases.

Figure 4:
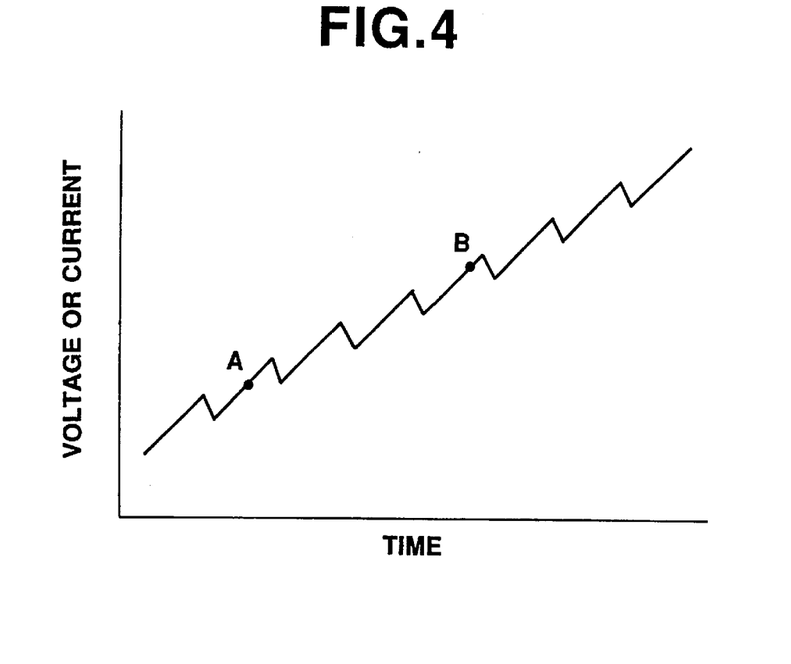
FIG. 4 is a schematically enlarged graph showing the increase in voltage or current by the increase of power input over time.

As is mentioned hereinabove, while power input is increased toward a certain value at which discharge voltage becomes the maximum value, both of discharge voltage and discharge current increases continuously (see FIG. 1). However, if an increasing portion of a curve shown in FIG. 1 with respect to discharge voltage or discharge current is magnified, the increasing portion has decreasing portions (see FIG. 4). That is, FIG. 4 shows a line having increasing portions and decreasing portions alternately. Thus, if signals of discharge voltage or discharge current are taken continuously, misinterpretation as to the timing of the decrease of discharge voltage from the maximum value may occur. Therefore, as is seen from FIG. 4, adjacent signals (A and B) of discharge voltage or discharge current should have a certain time interval therebetween. Furthermore, a condenser (for example, of about 0.1 μF) may be connected with a signal line of discharge voltage or of discharge current, or a software program for averaging values of several signals can be used for preventing the misinterpretation.

There is another type of misinterpretation by confusing the timing of the decrease of discharge voltage from the maximum value with the decrease of discharge voltage and discharge current upon abnormal discharge. In fact, when abnormal discharge occurs, power input is shut off by a protection circuit of a sputtering power supply. Therefore, both of discharge voltage and discharge current decrease suddenly.

Figure 5:
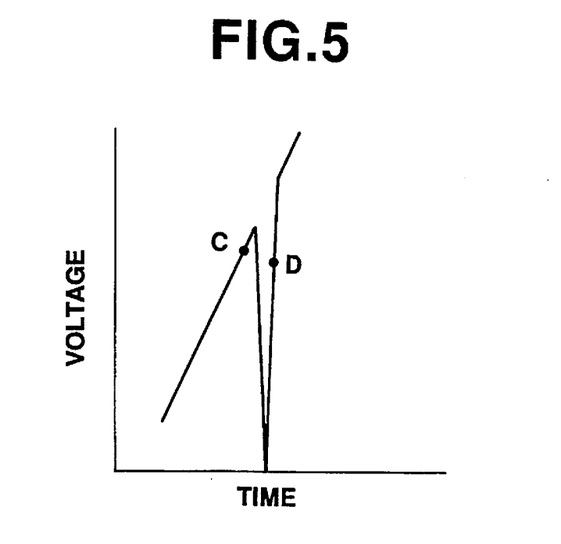
FIG. 5 is a schematically enlarged graph showing a sudden decrease of voltage caused by abnormal discharge during the increase of voltage.
Figure 6:
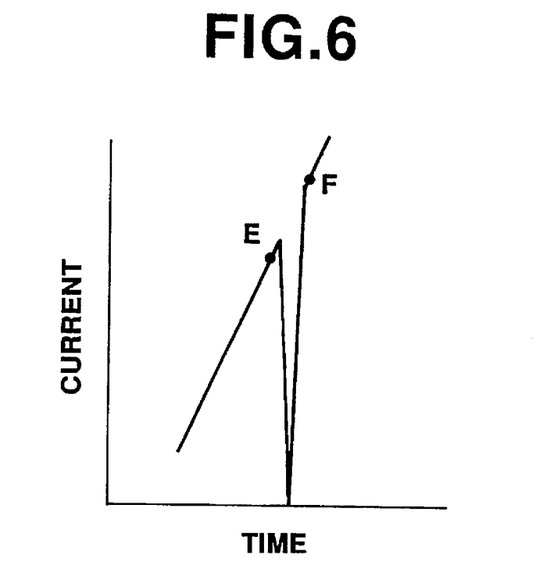
FIG. 6 is a graph similar to FIG. 5, but showing a sudden decrease of current caused by abnormal discharge during the increase of current.
Figure 7:
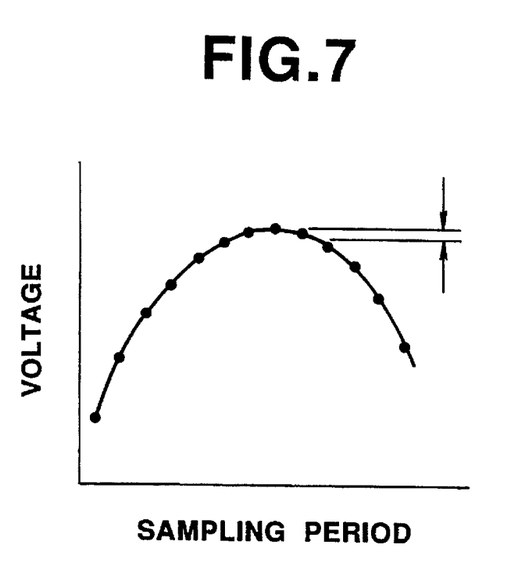
FIG. 7 is a graph showing increase and decrease of voltage over sampling periods.
Figure 8:
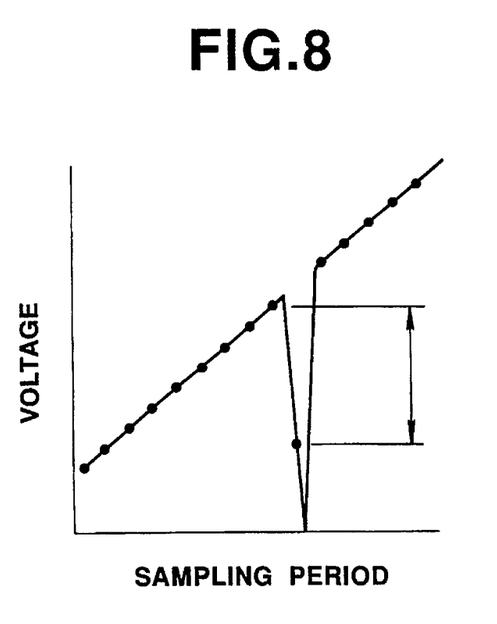
FIG. 8 is a graph showing a sudden decrease of voltage caused by abnormal discharge during increase of voltage over sampling periods.

As is seen from FIG. 5, when the sampling point C is higher than the sampling point D with respect to discharge voltage, it is interpreted that discharge voltage has decreased. As is seen from FIG. 6, when the sampling point E is lower than the sampling point F with respect to discharge current, it is interpreted that discharge current has increased. Therefore, if these interpretations are combined, it is erroneously interpreted that discharge voltage has decreased from the maximum value. Thus, a certain predetermined value with respect to discharge voltage difference between two adjacent sampling points is set up to distinguish between the decrease of discharge voltage from the maximum value and the decrease of discharge voltage by abnormal discharge. That is, as is seen from FIG. 7, when the discharge voltage difference between the two adjacent sampling points is not greater than the certain predetermined value, it is interpreted that discharge voltage has decreased from the maximum value. On the other hand, as is seen from FIG. 8, when the discharge voltage difference between the two adjacent sampling points is greater than the certain predetermined value, it is interpreted that discharge voltage has decreased by abnormal discharge.

Figure 9:
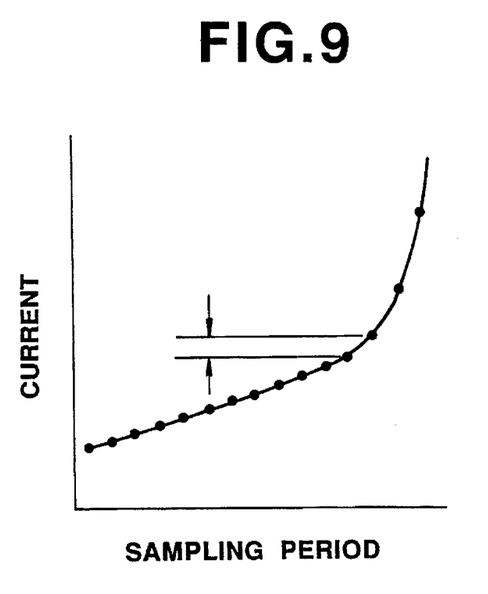
FIG. 9 is a graph showing an increase of current.
Figure 10:
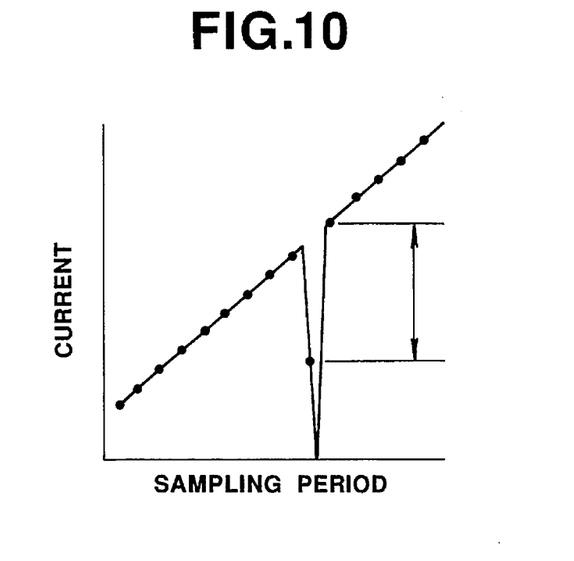
FIG. 10 is a graph showing a sudden decrease of current caused by abnormal discharge during increase of current over sampling periods.

Similarly, a certain predetermined value with respect to discharge current difference between two adjacent sampling points is set up to distinguish between the increase of discharge current upon the decrease of discharge voltage from the maximum value and the increase of discharge current by abnormal discharge. That is, as is seen from FIG. 9, when the discharge current difference between the two adjacent sampling points is not greater than the certain predetermined value, it is interpreted that discharge current has increased due to the decrease of discharge voltage from the maximum value. On the other hand, as is seen from FIG. 10, when the discharge current difference between the two adjacent sampling points is greater than the certain predetermined value, it is interpreted that discharge current has increased by abnormal discharge.

If the deviation of power input becomes too large, the film thickness is decreased and becomes inconstant. On the other hand, if the degree of decrease or the rate of decrease of power input is too small, an undesirable metal film tends to be formed on a substrate. If the rate of increase is too large, an undesirable metal film tends to be formed on a substrate.

As a substrate according to the present invention, various types of transparent glass can be used. In fact, the substrate can be an organic glass, a colorless or color glass. The substrate on which a metal oxide film is formed in accordance with the present invention can be a single plate glass, a laminated plate glass or a tempered plate glass.

EXAMPLE 1

Figure 11:
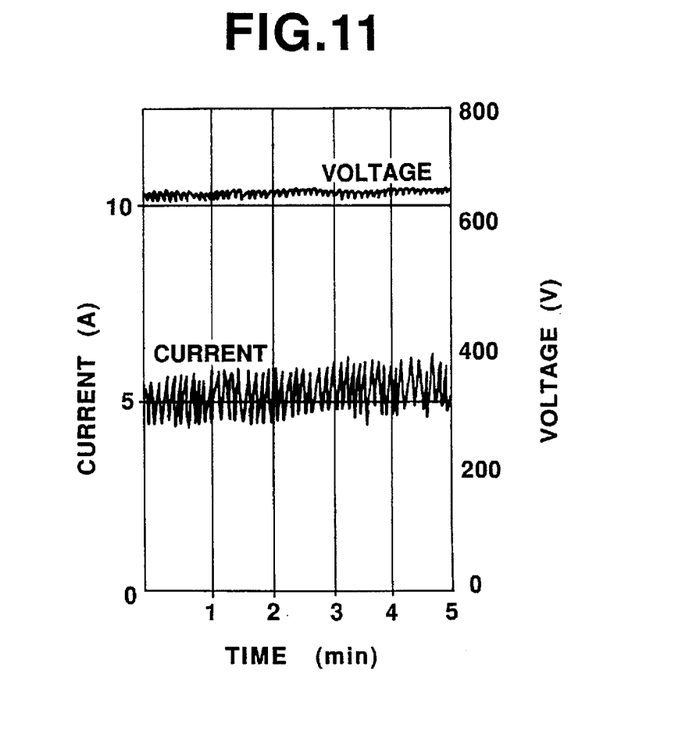
FIG. 11 is a graph showing real changes in discharge voltage and discharge current over time in accordance with Example 1 of the present invention.

A clear glass plate (F13) having widths of 450 mm and a thickness of 3 mm was washed with a neutral detergent, water and then isopropyl alcohol, and then dried. The glass plate was set in a vacuum chamber of a continuous magnetron sputtering device so as to move above a target of tungsten. The atmosphere was purged from the vacuum chamber by a vacuum pump to obtain a pressure not higher than about $5 \times 10^{-6}$ Torr. Then, oxygen gas was introduced into the vacuum chamber to obtain a pressure of about $5.0 \times 10^{-3}$ Torr. Then, argon gas was introduced into the vacuum chamber to obtain a total pressure of about $2.0 \times 10^{-2}$ Torr. The maximum discharge voltage was determined in a preliminary sputtering test. In a real sputtering, power input to the sputtering device was controlled in a manner shown in FIG. 3. That is, as is shown in FIG. 3, at first, power input was increased at a rate of about 50 W/sec at $\Delta w_1$. Then, at 80% of a power input at which the maximum discharge voltage is obtained, power input was increased at a rate of about 30 W/sec at $\Delta w_2$. Immediately after detecting the decrease of discharge voltage and the steep increase of discharge current, power input was decreased at a rate of about 7 kW/sec at $\Delta w_3$ by about 700 W. Immediately after that, power input was increased at a rate of 150 W/sec at $\Delta w_4$. Then, the decrease and increase of power input at $\Delta w_3$ and $\Delta w_4$ were alternately repeated about 12 to 13 times per minute for a certain period to complete a tungsten oxide (WO$_3$) film formation on a substrate. A real chart with respect to the changes in discharge voltage and discharge current during sputtering is shown in FIG. 11. The total sputtering period was about 5 min.

EXAMPLE 2

A sputtering process of Example 1 was modified with respect to the metal type for a target and the control pattern of power input. As a target, tantalum was used. In a real sputtering, power input to the sputtering device was controlled in a manner shown in FIG. 3. That is, as is shown in FIG. 3, at first, power input was increased at a rate of about 100 W/sec at $\Delta w_1$. Then, at 70% of a power input at which the maximum discharge voltage is obtained, power input was increased at a rate of about 50 W/sec at $\Delta w_2$. Immediately after detecting the decrease of discharge voltage from the maximum value and the steep increase of discharge current, power input was decreased at a rate of about 28 kW/sec at $\Delta w_3$ by about 2.8 kW. Immediately after that, power input was increased at a rate of about 500 W/sec at $\Delta w_4$. Then, the decrease and increase of power input at $\Delta w_3$ and $\Delta w_4$ were alternately repeated about 12 to 13 times per minute for a certain period to complete a tantalum oxide (Ta$_2$O$_5$) film formation on a substrate. The total sputtering period was about 10 min.

EXAMPLE 3

A sputtering process of Example 2 was modified with respect to the flow rate of oxygen gas and argon gas and the control pattern of power input. 32 sccm of oxygen gas and 200 sccm of argon gas were introduced into the vacuum chamber to obtain a total pressure of about $2.0 \times 10^{-2}$ Torr. Power input was controlled in such a manner that a period for the duration in which discharge voltage is decreased at $\Delta w_3$ and increased at $\Delta w_4$ is about 5 sec and that a deviation of discharge voltage is not larger than 5% of the average of the maximum discharge voltage. In the sputtering, the occurrence of abnormal discharge was five times. However, impurities were almost not observed on the substrate.

EXAMPLE 4

A sputtering process of Example 3 was modified with respect to the flow rate of oxygen gas and the control pattern of power input. 16 sccm of oxygen gas was introduced into the vacuum chamber. Power input was controlled in such a manner that a period for the duration in which discharge voltage is decreased at $\Delta w_3$ and increased at $\Delta w_4$ is about 3 sec and that a deviation of discharge voltage is not larger than 2% of the average of the maximum discharge voltage. In the sputtering, abnormal discharge did not occur, and impurities were not observed on the substrate.

COMPARATIVE EXAMPLE 1

A sputtering process of Example 1 was modified with respect to the control pattern of power input. A constant power input was applied to a sputtering device so as to set a maximum discharge voltage of about 640 V.

COMPARATIVE EXAMPLE 2

A sputtering process of Example 3 was modified with respect to the control pattern of power input. A constant power input was applied to a sputtering device so as to set the discharge voltage at about 650 V which is the maximum value. The occurrence of abnormal sputtering was not less than 50 times, and a lot of impurities were observed on the substrate.

EVALUATION TEST

The obtained films formed on the substrates according to Examples 1–4 and Comparative Examples 1 and 3 were tested with respect to the film thickness and the visible light transmittance. A front side of the substrate in the vacuum chamber, which is perpendicular to a direction in which the substrate is moved, was named H1. A side of the substrate in the vacuum chamber, which is parallel to a direction in which the substrate is moved, was named H2. The film thickness and the visible light transmittance of the film were measured at three positions a, b and c on the substrate. The position "a" was 11 cm from the side H1 and 22.5 cm from the side H2. The position "b" was 23 cm from the side H1 and 22.5 cm from the side H2. The position "c" was 34 cm from the side H1 and 22.5 cm from the side H2. The result is shown in Table.

TABLE

|  | Film Thickness (nm) | Visible Light Transmittance (%) |
| --- | --- | --- |
| Ex. 1 | | |
| Position a | 104 | 81 |
| Position b | 108 | 82 |
| Position c | 106 | 82 |
| Ex. 2 | | |
| Position a | 187 | 84 |
| Position b | 188 | 83 |
| Position c | 186 | 84 |
| Ex. 3 | | |
| Position a | 193 | 84 |
| Position b | 194 | 84 |
| Position c | 194 | 84 |
| Ex. 4 | | |
| Position a | 181 | 81 |
| Position b | 188 | 82 |
| Position c | 183 | 82 |
| Com. Ex. 1 | | |
| Position a | 89 | 73 |
| Position b | 81 | 73 |
| Position c | 74 | 71 |
| Com. Ex. 3 | | |
| Position a | 179 | 81 |
| Position b | 168 | 78 |
| Position c | 160 | 76 |

What is claimed is:

1. A method of forming a metal oxide film on a substrate by a reactive DC sputtering device in the presence of a reaction gas and an inert gas, comprising the steps of:

(a) increasing a power input to the sputtering device to a first predetermined value such that a discharge voltage increases to a maximum value and then decreases from the maximum value;

(b) decreasing the power input continuously from the first predetermined value to a second predetermined value immediately after the discharge voltage starts to decrease from the maximum value so as to suppress a metal formation on the substrate; and (c) increasing the power input continuously immediately after the power input reaches the second predetermined value until the discharge voltage starts to decrease from the maximum value, the steps (b) and (c) being alternately repeated continuously for a certain period for completing formation of the metal oxide film on the substrate;

wherein deviation of the discharge voltage during the steps (b) and (c) is set to be not greater than 6% of the average maximum discharge voltage.

2. A method according to claim 1, wherein oxygen gas as a reactive gas and argon gas as an inert gas are introduced into the sputtering device.

3. A method according to claim 1, wherein a period for the steps (b) and (c) is not longer than 6 sec.

4. A method according to claim 1, wherein a flow rate ratio or a pressure ratio of the reaction gas to the inert gas is regulated to be not higher than 0.4.

5. A method according to claim 1, wherein in step (b) the power input is decreased at a first constant rate of power per unit of time, and in step (c) the power input is increased at a second constant rate of power per unit of time.

6. A method according to claim 1, wherein flow rates of the reaction gas and the inert gas are respectively maintained constant from beginning to end of the metal oxide formation.

* * * * *